Nov. 23, 1965 R. F. FOSTER 3,219,932
POWER SUPPLY FOR A TRANSISTORIZED STAGE IN A BROADCAST RECEIVER
Filed Nov. 7, 1962
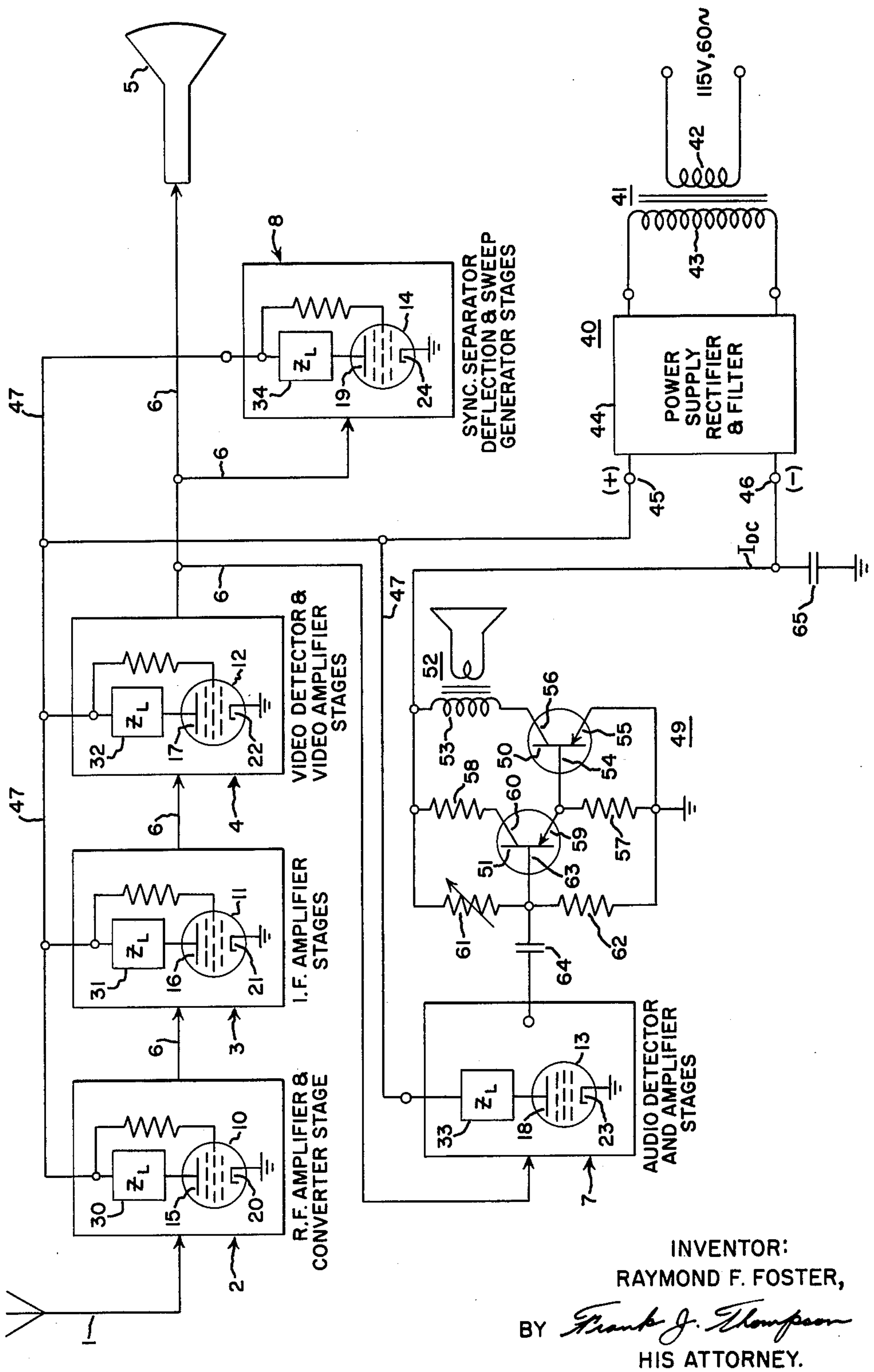
INVENTOR:
RAYMOND F. FOSTER,
BY Frank J. Thompson
HIS ATTORNEY.

United States Patent Office 3,219,932
Patented Nov. 23, 1965

3,219,932

POWER SUPPLY FOR A TRANSISTORIZED STAGE IN A BROADCAST RECEIVER

Raymond F. Foster, Syracuse, N.Y., assignor to General Electric Company, a corporation of New York Filed Nov. 7, 1962, Ser. No. 236,069
2 Claims. (Cl. 325—318)

This invention relates to broadcast receiving apparatus of the type utilizing electron discharge amplifying devices and at least one semiconductor amplifying device. The invention relates more particularly to a means for providing electrical operating power for the semiconductor amplifying device.

In some present-day television and radio receivers, it is desirable, for reasons of economy to employ a combination of electron discharge and semiconductor amplifying devices. For example, in some receivers it is desirable to provide an audio output stage having a semiconductor amplifying device while retaining conventional electron discharge amplifying device circuits throughout other stages of the receiver. Such a transistor circuit arrangement generally requires a relatively low D.C. voltage and relatively high current constant-current power supply whereas the electron discharge amplifying devices generally require a source of relatively high and constant D.C. anode operating voltage. More specifically, a typical transistorized single-ended class A audio output stage which provides 2 watts of audio output power requires a power supply for the output stage providing approximately 200 ma. at 20 volts D.C. while the electron discharge devices in other stages of the receiver generally require D.C. operating voltages exceeding 125 volts. Furthermore, because of the relative compactness of present-day receivers and the accompanying higher operating temperatures encountered in receivers utilizing electron discharge amplifying devices, considerable voltage stabilization is required for the transistor circuit in order to prevent thermal runaway and resulting destruction of the transistor. These divergent power supply requirements, and the additional requirement for the provision of a transistor circuit stabilization means, undesirably adds to the cost of the receiving apparatus.

A circuit arrangement is known in the art for providing the required D.C. operating power for a transistor in a broadcast receiving apparatus having stages including electron discharge amplifying devices. In this arrangement an emitter-base circuit of the transistor is connected in series with a series connected string of filaments of the electron discharge amplifying devices. A relatively low operating D.C. potential for the electron discharge device is also coupled between collector and emitter electrodes of the transistor. This circuit arrangement is suitable in receiving apparatus of the type wherein the filaments of the electron discharge devices are heated by a direct current and the anode potential does not exceed the collector-emitter breakdown voltage, such as is found in some portable radio receivers. However, such an arrangement is not suitable for use in receiving apparatus wherein the filaments of the electron discharge amplifying devices are heated by alternating currents and relatively high anode operating potentials are employed.

Accordingly, it is an object of this invention to provide in an electrical apparatus having stages including a plurality of electron discharge amplifying devices and a stage including at least one semiconductor amplifying device, a constant-current power supply for the semiconductor stage.

Another object of this invention is to provide in a broadcast receiving apparatus having stages including electron discharge amplifying devices and a stage including at least one transistor amplifying device, a relatively economical constant-current source of operating power for the transistor.

A further object of this invention is to provide in a broadcast receiving apparatus including stages having electron discharge amplifying devices and a stage including at least one transistor amplifying device, a means for providing a constant-current source of operating power for the transistor which eliminates the necessity for providing external voltage stabilization means.

Still another object of this invention is to provide in an electrical receiving apparatus having stages including at least one transistor and a plurality of electron discharge amplifying devices each having a cathode heated by alternating current and anode voltages exceeding the collector-emitter breakdown voltage of the transistor, an economical constant-current source of power for the transistor.

In accordance with the present invention, electrical receiving apparatus is provided having stages including a plurality of electron discharge amplifying devices and a stage including at least one semiconductor amplifying device. A source of direct-current anode operating potential for the electron discharge amplifying devices is provided. Means are included for coupling the semiconductor amplifying device between the source of anode operating potential and the electron discharge amplifying devices in a manner for providing that a direct-current operating current, $I_{DC}$, supplied by the anode potential source and flowing between the source of anode potential and the electron discharge amplifying devices flows between output electrodes of the transistor to thereby provide a constant-current power supply for the transistor stage.

Further objects, features, and the attending advantages of the invention will be apparent with reference to the following specification and the drawing which is a diagram, partly in block form, illustrating an electrical receiving apparatus utilizing an embodiment of the invention.

Referring now to the drawing, the electrical signal receiving apparatus illustrated therein is shown to comprise a broadcast television receiver. Although a television receiver is illustrated, other electrical signal receiving apparatus as may occur to those skilled in the art may suitably employ the invention described hereinafter. The television receiver includes five operational stages whose functions are diagrammatically represented by separate blocks. A radio frequency signal which is amplitude modulated by a composite video signal is induced in an antenna 1, coupled to a stage 2 where it is amplified and converted to an IF frequency and further amplified by IF amplifiers in a stage #3. The composite video signal is detected and amplified in a video detector and video amplifier stage 4 and coupled to a cathode ray picture tube 5 for intensity modulating an electron beam which is generated therein. Coupling of the IF and composite video alternating voltages between stages is indicated generally by the lines 6. An audio stage 7 is provided for detecting and amplifying an audio signal. In addition, conventional sync-separator deflection and sweep generator circuits are also provided and represented by a block 8.

The referred-to stages 2, 3, 4, 7 and 8 include a plurality of electron discharge amplifying devices. For simplification in the explanation of the present invention, these stages are illustrated as having pentode electron discharge amplifying devices 10, 11, 12, 13 and 14 respectively included within the stage block. It is understood, however, that triode or other electron discharge amplifying devices may be substituted or included within the stages depending on the requirements of the particular receiver and that the arrangement of devices shown may be varied for the particular electrical receiving apparatus without departing from the spirit of the present invention. The amplifying devices include anode electrodes 15, 16, 17, 18 and 19 respectively, and cathode electrodes 20, 21, 22, 23 and 24 respectively. D.C. load impedances 30, 31, 32, 33 and 34 respectively are provided for the amplifying device in each stage.

A power supply 40 for supplying a direct-current anode operating potential is shown and includes a power transformer 41 having primary and secondary windings 42, 43 and rectifier and filter circuits indicated by the block 44. Although a power transformer type of power supply is described, a transformerless type of power supply is equally applicable for use with the present invention. The power supply 40 has output terminals 45 and 46 between which a direct-current output potential of relative positive and negative polarity exists. The positive terminal 45 is shown direct-current coupled to the anode electrodes 15, 16, 17, 18 and 19 by means including suitable wiring connections represented by lines 47 and by the associated D.C. load impedances of the respective electron discharge amplifying devices. As is conventional in receiving apparatus, a common bus is provided for the receiver. The common bus is indicated by the individual connection of each of the cathode electrodes to a common potential and it will be understood that the common bus may be a wire or the chassis of the receiver, as is conventional. The negative terminal 46 of the power supply 40 is coupled to the cathodes of the electron discharge amplifying devices by means described hereinafter.

An additional operational stage comprising an audio output stage 49 is provided and includes an audio output transistor 50 and an audio driver transistor 51. An output transformer 52 having a winding 53 is shown for transforming the electrical impedance of a loudspeaker to a suitable value of load impedance for the transistor 50. This circuit including the transistor 50 and the output load is arranged in a common-emitter amplifying configuration having audio signal input electrodes comprising base and emitter electrodes 54 and 55 respectively and output electrodes comprising emitter and collector electrodes 55 and 56 respectively. That portion of the output stage 49 including transistor 51 is arranged as an emitter-follower amplifier having emitter and collector load resistors 57 and 58 connected to emitter and collector electrodes 59 and 60 respectively. Emitter 59 is direct-current coupled to the base electrode 54 of the output transistor 50. A resistive base electrode biasing network is also provided and includes resistors 61 and 62. Audio frequency signals, which have been detected and amplified in stage 7, are coupled to a base electrode 63 of the driver transistor 51 by a capacitor 64. A capacitor 65, whose function is described hereinafter, is coupled in parallel with the output stage 49. As previously indicated, the utilization of the output transistor 50 is advantageous in that the cost of the output circuit is reduced over an equivalent output circuit utilizing electron discharge amplifying devices. However, as previously indicated, it is desirable that a constant-current relatively low D.C. voltage power source be provided for the output stage 49.

In accordance with a feature of the present invention, the audio output circuit is coupled to the power supply 40 in a manner for providing that a D.C. operating current, $I_{DC}$, which is supplied by the power supply to the electron discharge amplifying devices, flows serially between the power supply 40, output electrodes 55 and 56 of the transistor 50, and the electron discharge amplifying devices to thereby provide essentially a constant-current source of power for the audio output stage. Referring once again to the drawing for an explanation of the arrangement, the relatively negative terminal 46 of the power supply is shown direct-current coupled to the transformer 52 and serially via the winding 53 to the collector electrode 56 of the transistor 50. The emitter output electrode 55 is direct-current coupled to the common bus. In tracing the flow of D.C. operating current, $I_{DC}$, between the positive terminal 45 and the negative terminal 46 of supply 40, it may be seen that the current flows in series with the output electrodes 55 and 56 of the transistor 50. A small portion of the current $I_{DC}$ is directed to the driver circuit for supplying operating power to the transistor 51 and to the base biasing resistors 61 and 62. However, because of the impedance presented to the current by the driver circuit, substantially all of the current $I_{DC}$ flows between the output electrodes 55 and 56. The capacitor 65 provides a complete alternating current circuit loop for the stage 49 thereby eliminating audio components from the power supply. In addition, the capacitor advantageously by-passes around the stage 49 any alternating components of apparatus current which may undesirably flow with $I_{DC}$. This circuit arrangement thus provides an economical constant-current power source for the output stage 49. Although a voltage drop of approximately 20 volts D.C. will occur across the output circuit, this drop may economically be compensated for in the case of a transformer type power supply by increasing the number of turns on secondary winding 43 of the power transformer 41 to provide a desired output voltage as measured between terminal 45 and ground.

In addition to the savings provided by utilizing this circuit arrangement, the constant-current power supply also makes thermal runaway and consequent destruction of the transistors impossible. This feature advantageously eliminates the necessity of providing additional voltage stabilization circuit elements directed specifically to this problem. These results follow because the current $I_{DC}$ flowing in the transistor circuits comprises the operating current flowing in the electron discharge amplifying devices in other stages of the receiver and is substantially independent of the impedance of stage 49, even as temperature increases. As the temperature of the receiver and the semiconductor 50 increases, the only effect of rising temperature on the transistor circuit is to decrease the collector voltage and to cause a corresponding decrease in the maximum available output power.

While I have illustrated and described and have pointed out in the annexed claims certain novel features of my invention, it will be understood that various omissions, substitutions and changes in the forms and details of the system illustrated may be made by those skilled in the art without departing from the spirit of the invention and the scope of the claims.

What I claim as new and desire to secure by Letters Patent of the United States is:

1. A television receiver having operational stages including a plurality of electron discharge amplifying devices; each of said electron discharge amplifying devices having anode and cathode electrodes; a common bus for said receiver; means direct-current coupling said cathode electrodes to said bus; a direct-current power supply for said receiver having first and second output terminals of relative positive and negative polarity respectively; means direct-current coupling said first output terminal to said anode electrodes; an audio output stage for said receiver including a transformer having a winding, and a transistor having first and second output electrodes; means serially connecting said winding to one of said output electrodes; and means connecting said series connected winding and transistor between said second output terminal and said ground bus whereby an operating current for said operational stage flows between said transistor first and second electrodes and provides a constant current source therefor.

2. A television receiver having operational stages including a plurality of electron discharge amplifying devices; each of said electron discharge amplifying devices having anode and cathode electrodes; a common bus for said receiver; means direct-current coupling said cathode electrodes to said bus; a direct-current power supply for said receiver; said power supply having first and second output terminals of relative positive and negative polarity respectively; means direct-current coupling said first output terminal to said anode electrodes; an audio output stage for said receiver including a transformer having a winding and a transistor having collector, emitter and base electrodes; means connecting said winding between said second output terminal and said collector electrode; means connecting said emitter electrode to said ground bus; a source of audio signals; and means coupling said audio signal from said source to said base electrode.

References Cited by the Examiner

UNITED STATES PATENTS

| | | | |
|---|---|---|---|
| 2,628,310 | 2/1953 | Wood | 325—492 |
| 2,970,213 | 1/1961 | Dukat | 325—318 |
| 3,059,109 | 10/1962 | Silberbach | 325—318 |
| 3,061,784 | 10/1962 | Fibranz | 325—319 |

OTHER REFERENCES

Chance et al.: Waveforms, MIT Radiation Laboratory Series, vol. 9, McGraw-Hill Book Company, Inc., New York, 1949, page 643.

ROBERT H. ROSE, *Primary Examiner.*

DAVID G. REDINBAUGH, *Examiner.*